(12) United States Patent
Kuo et al.

(10) Patent No.: US 6,414,362 B1
(45) Date of Patent: Jul. 2, 2002

(54) POWER SEMICONDUCTOR DEVICE

(75) Inventors: Frank Kuo, Kaohsiung (TW); Mohammed Kasem, Santa Clara, CA (US); Sen Mao; Oscar Ou, both of Kaohsiung (TW); Sam Kuo, Ping-Tung (TW)

(73) Assignee: Siliconx (Taiwan) Ltd., Kaohsiung (TW)

( * ) Notice: Subject to any disclaimer, the term of this patent is extended or adjusted under 35 U.S.C. 154(b) by 0 days.

(21) Appl. No.: 09/879,467

(22) Filed: Jun. 12, 2001

(51) Int. Cl.[7] .............................................. H01L 31/113
(52) U.S. Cl. ........................ 257/382; 257/139; 257/140; 257/305; 257/341; 257/630; 257/700
(58) Field of Search ................................. 257/139, 140, 257/147, 151, 301, 305, 341, 382, 630, 700; 357/15, 23, 38, 68

(56) References Cited

U.S. PATENT DOCUMENTS 3,950,777 A * 4/1976 Tarui et al. ................. 257/330
4,862,239 A * 8/1989 Broich et al. ................ 257/135
5,703,383 A * 12/1997 Nakayama ................... 257/139
5,736,760 A * 4/1998 Hieda et al. ................. 257/301

* cited by examiner

Primary Examiner—David Nelms
Assistant Examiner—Dao H Nguyen
(74) Attorney, Agent, or Firm—Knobbe Martens Olson & Bear, LLP

(57) ABSTRACT

A power semiconductor device includes a die having a drain contact, a source contact, a primary gate contact, a partitioning region that partitions the source contact, and a secondary gate contact disposed in the partitioning region. A conductive strip is connected to the primary and secondary gate contacts. An insulation layer encloses a segment of the conductive strip. A conductive connecting member includes a metal sheet and a conductive paste. The metal sheet is attached to the source contact via the conductive paste and is formed with a groove to expose the insulation layer from the metal sheet.

1 Claim, 3 Drawing Sheets

POWER SEMICONDUCTOR DEVICE

BACKGROUND OF THE INVENTION

1. Field of the Invention

This invention relates to a power semiconductor device, more particularly to a power semiconductor device having a comb-shaped source contact and a plurality of gate contacts that are electrically isolated from the source contact.

2. Description of the Related Art

FIGS. 1 and 2 illustrate a conventional power semiconductor device. The power semiconductor device includes a semiconductor die 11 which includes a plurality of transistors (not shown). Each transistor includes a source electrode, a drain electrode, and a gate electrode. The die 11 has a bottom surface that defines a drain contact 113 connected to the drain electrodes of the transistors, and a top surface that includes a comb-shaped first metallized region defining a source contact 111, a second metallized region defining a primary gate contact 112, a comb-shaped partitioning region 115' having a plurality of spaced apart branches 115, and a plurality of spaced apart third metallized regions (not shown) defining a plurality of secondary gate contacts and disposed in the branches 115 of the partitioning region 115'. The source contact 111 is connected to the source electrodes of the transistors, and has a plurality of grooves 117 and a plurality of non-grooved parts disposed respectively between two adjacent ones of the grooves 117. The branches 115 of the partitioning region 115' are respectively confined by the grooves 117. The primary gate contact 112 and the secondary gate contacts of the third metallized regions are connected to the gate electrodes of the transistors.

The power semiconductor device further includes a bottom metal plate 12 coupled to and electrically connected to the drain contact 113, a plurality of drain terminals 123 extending outwardly from the bottom metal plate 12 to permit electrical connection with the drain contact 113, a plurality of source terminals 121 electrically connected to the source contact 111 via a metal sheet 13, a gate terminal 122 electrically connected to the primary gate contact 112 via a conductive piece, and a comb-shaped conductive path 114 connected to the primary gate contact 112 and having a plurality of fingers 1141 that extend respectively into the branches 115 of the partitioning region 115' to connect with the secondary gate contacts of the third metallized regions.

Each finger 1141 of the conductive path 114 is enclosed by an insulation layer 116, such as a glassivation layer. The metal sheet 13 covers most part of the source contact 111 and the branches 115 of the partitioning region 115', and is attached to the source contact 111 via a conductive paste 14 that covers the branches 115 of the partitioning region 115'. Each finger 1141 of the conductive path 114 is isolated electrically from the conductive paste 14 by the respective insulation layer 116.

The aforesaid power semiconductor device is disadvantageous in that since the die 11 generates heat during operation, thereby resulting in an increase in the temperature of the die 11, and since the insulation layer 116 at each finger 1141 of the conductive path 114 is covered with the conductive paste 14 and the metal sheet 13, formation of crevices 10 can take place in the insulation layer 116 because of stress, that results from different thermal expansions of the metal sheet 13, the conductive paste 14 and the insulation layer 116. The crevices 10 in the insulation layer 116 may be filled with moisture and/or deposits which can become conductive and which can electrically interconnect the fingers 1141 of the conductive path 114 and the conductive paste 14, thereby resulting in a short circuit among the gate electrodes and the source electrodes. Moreover, since the conductive paste 14 is covered by the metal sheet 13, there is also a tendency for the conductive paste 14 to have crevices formed thereinside because of the thermal expansion and contraction of the conductive paste 14 and the metal sheet 13, thereby resulting in an unstable performance in the electrical resistance of the device.

SUMMARY OF THE INVENTION

Therefore, the object of the present invention is to provide a power semiconductor device that is capable of overcoming the aforementioned problems.

According to the present invention, a power semiconductor device comprises: a semiconductor die that has a bottom surface defining a drain contact, and a top surface which includes a first metallized region defining a source contact and having at least a first groove and a first non-grooved part, a second metallized region defining a primary gate contact, a partitioning region having at least a branch confined by the first groove, and a third metallized region disposed in the branch of the partitioning region and defining a secondary gate contact; a conductive strip extending from the primary gate contact and having a finger that extends in the branch of the partitioning region and that is connected to the secondary gate contact of the third metallized region; an insulation layer enclosing the finger of the conductive strip; a conductive connecting member including a metal sheet and a conductive paste, the metal sheet having a second groove which is aligned with the branch of the partitioning region, and a second non-grooved part which is attached to the source contact at the first non-grooved part of the first metallized region via the conductive paste such that the insulation layer is exposed from the second groove; a drain terminal electrically connected to the drain contact of the die; a source terminal electrically connected to the second non-grooved part of the metal sheet; and a gate terminal electrically connected to the primary gate contact of the die.

BRIEF DESCRIPTION OF THE DRAWINGS

In drawings which illustrate an embodiment of the invention.

DETAILED DESCRIPTION OF THE PREFERRED EMBODIMENT

Figure 1:
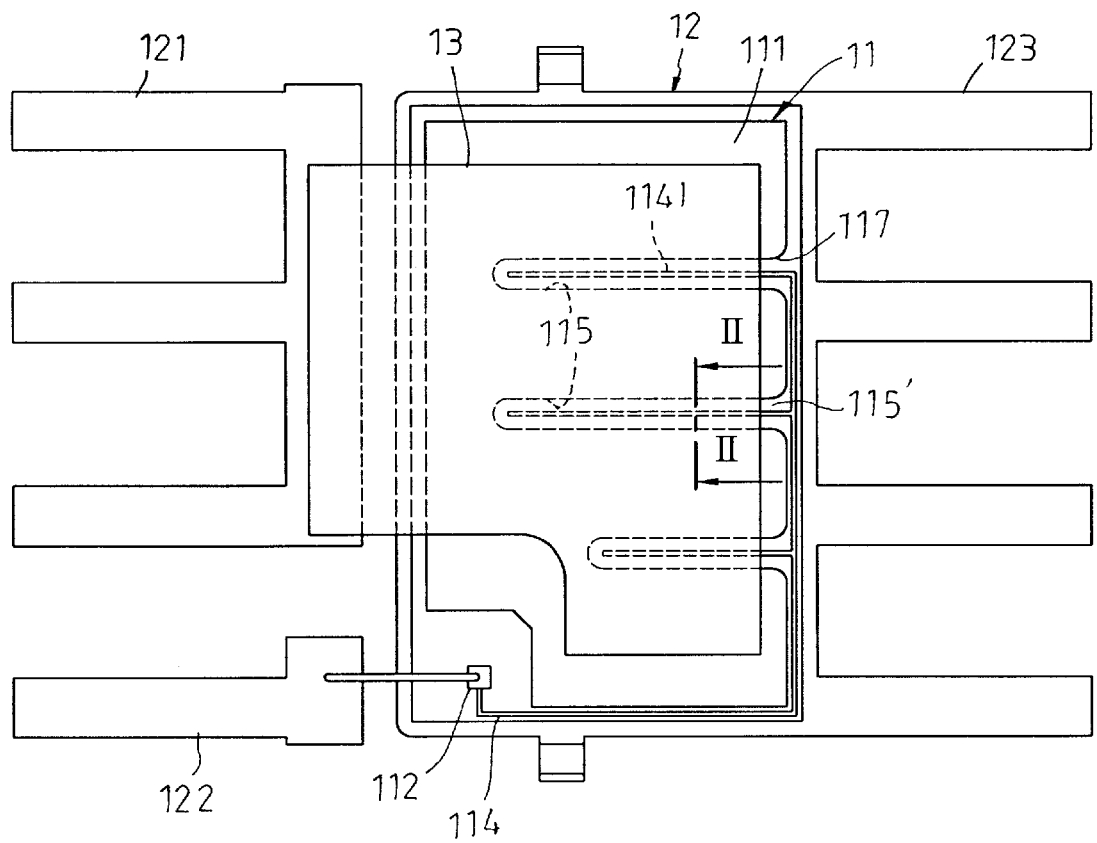
FIG. 1 is a schematic top view of a conventional power semiconductor device.
Figure 2:
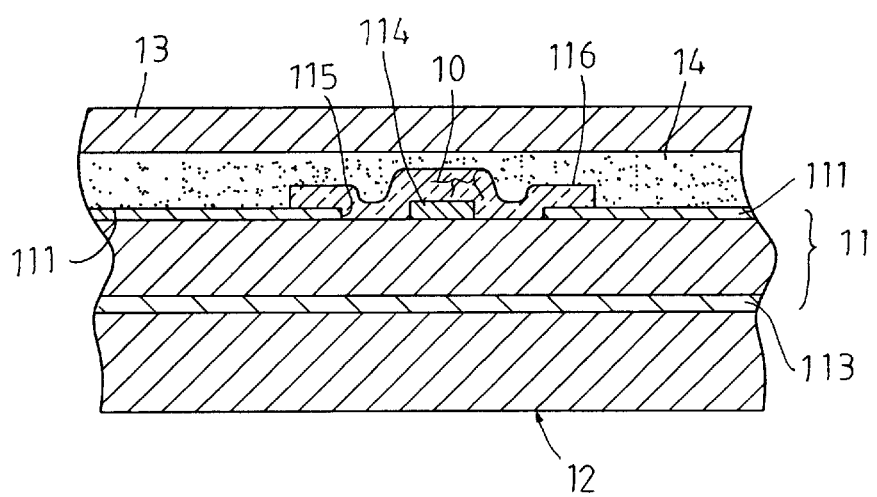
FIG. 2 is a fragmentary cross-sectional side view of the conventional power semiconductor device of FIG. 1 taken along line II—II.
Figure 3:
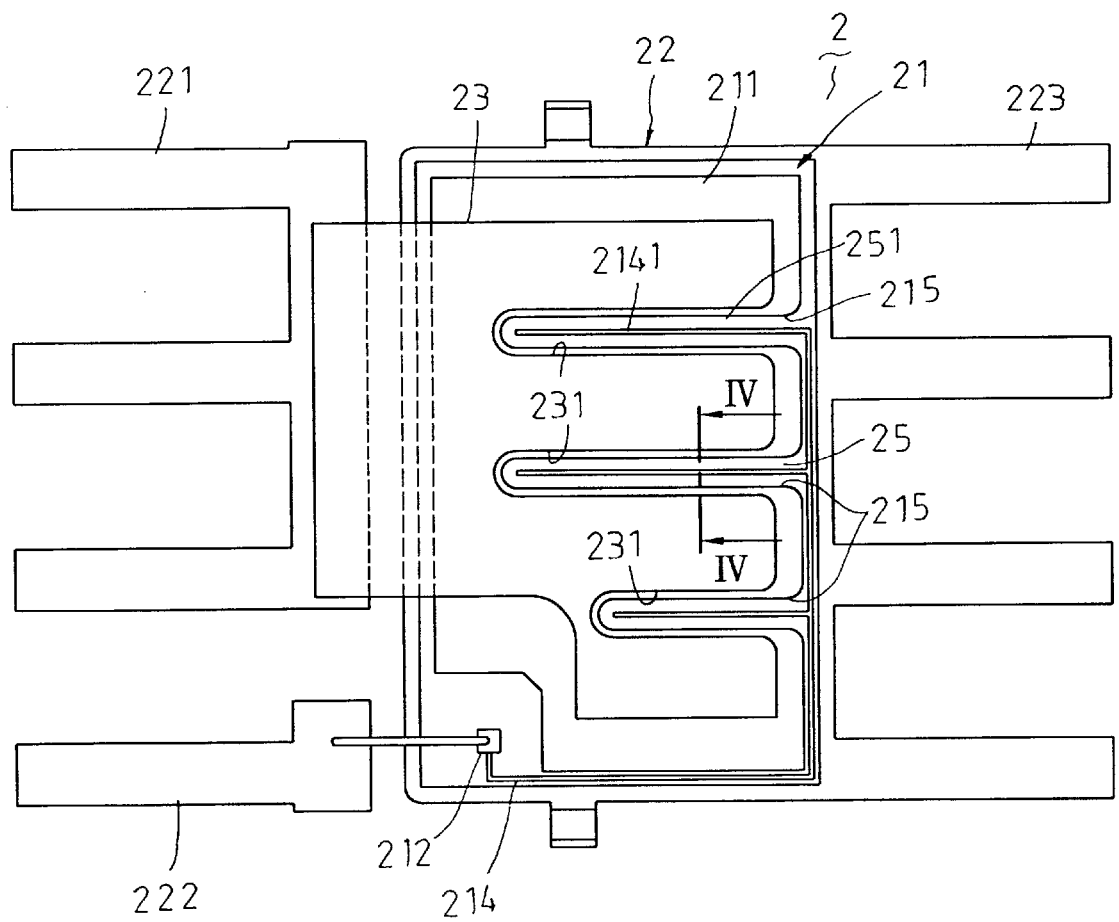
FIG. 3 is a schematic top view of a power semiconductor device embodying this invention.
Figure 4:
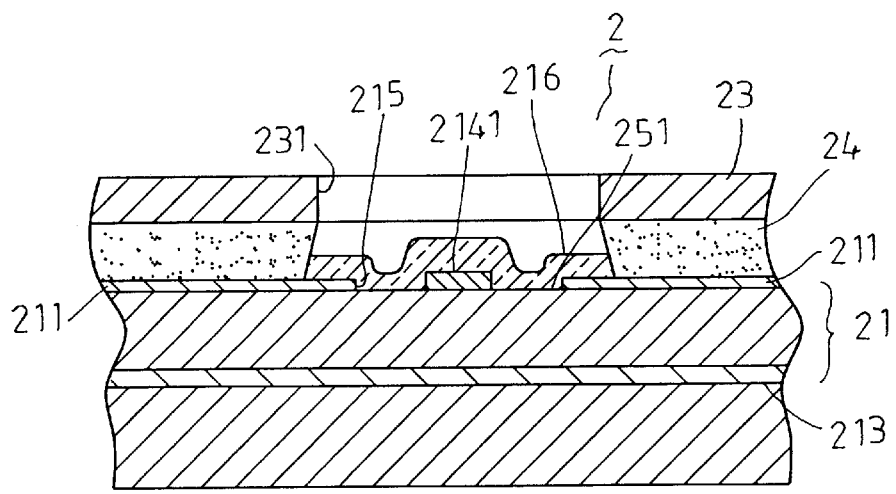
FIG. 4 is a fragmentary cross-sectional side view of the power semiconductor device of FIG. 3 taken along line IV—IV.

FIGS. 3 and 4 illustrate a power semiconductor device 2 embodying this invention. The power semiconductor device 2 includes a semiconductor die 21 which includes a plurality of transistors (not shown). Each transistor includes a source electrode, a drain electrode, and a gate electrode. The die 21 has a bottom surface that defines a drain contact 213 connected to the drain electrodes of the transistors, and a top surface that includes a comb-shaped first metallized region defining a source contact 211, a second metallized region defining a primary gate contact 212, a comb-shaped partitioning region 25 having a plurality of spaced apart branches 251, and a plurality of spaced apart third metallized regions (not shown) defining a plurality of secondary gate contacts and disposed in the branches 251 of the partitioning region 25.

The source contact 211 is connected to the source electrodes of the transistors, and has a plurality of first grooves 215 and a plurality of first non-grooved parts disposed respectively between two adjacent ones of the first grooves 215. The branches 251 of the partitioning region 25 are respectively confined by the first grooves 215. The primary gate contact 212 and the secondary gate contacts of the third metallized regions are connected to the gate electrodes of the transistors.

The power semiconductor device 2 further includes a bottom metal plate 22 coupled to and electrically connected to the drain contact 213, a plurality of drain terminals 223 extending outwardly from the bottom metal plate 22 to permit electrical connection with the drain contact 213, a plurality of source terminals 221 electrically connected to the source contact 211 via a conductive connecting member that will be described in the succeeding paragraphs, a gate terminal 222 electrically connected to the primary gate contact 212 via a conductive piece, and a comb-shaped conductive strip 214, such as a conductive wire, connected to the primary gate contact 212 and having a plurality of fingers 2141 that extend respectively into the branches 251 of the partitioning region 25 to connect with the secondary gate contacts of the third metallized regions.

Each finger 2141 of the conductive strip 214 is enclosed by an insulation layer 216, such as a glass layer, so as to be electrically isolated from the conductive paste 24.

The conductive connecting member includes a comb-shaped metal sheet 23 and a conductive paste 24 that contains tin or silver. The metal sheet 23 has a plurality of second grooves 231 which are aligned respectively with the branches 251 of the partitioning region 25, and a plurality of second non-grooved parts which are disposed between two adjacent ones of the second grooves 231 and which are attached to the source contact 211 at the first non-groove parts of the first metallized region via the conductive paste 24 such that the insulation layer 216 at each finger 2141 of the conductive strip 214 is exposed from the respective second groove 231 in the metal sheet 23.

Since the insulation layer 216 at each finger 2141 of the conductive strip 214 is exposed from the respective second groove 231 of the metal sheet 23, the stress resulting from different thermal expansions of the insulated layer 216, the metal sheet 23, and the conductive paste 24 no longer exists, thereby eliminating the formation of the crevices in the insulation layer 216 as normally encountered in the prior art. Moreover, since the conductive paste 24 forms a plurality of grooves at the branches 251 of the partitioning region 25, such grooves can release the stress resulting from the thermal expansion and contraction of the metal sheet 23 and the conductive paste 24, thereby eliminating the formation of the crevices in the conductive paste 24 as encountered in the prior art.

Figure 5A:
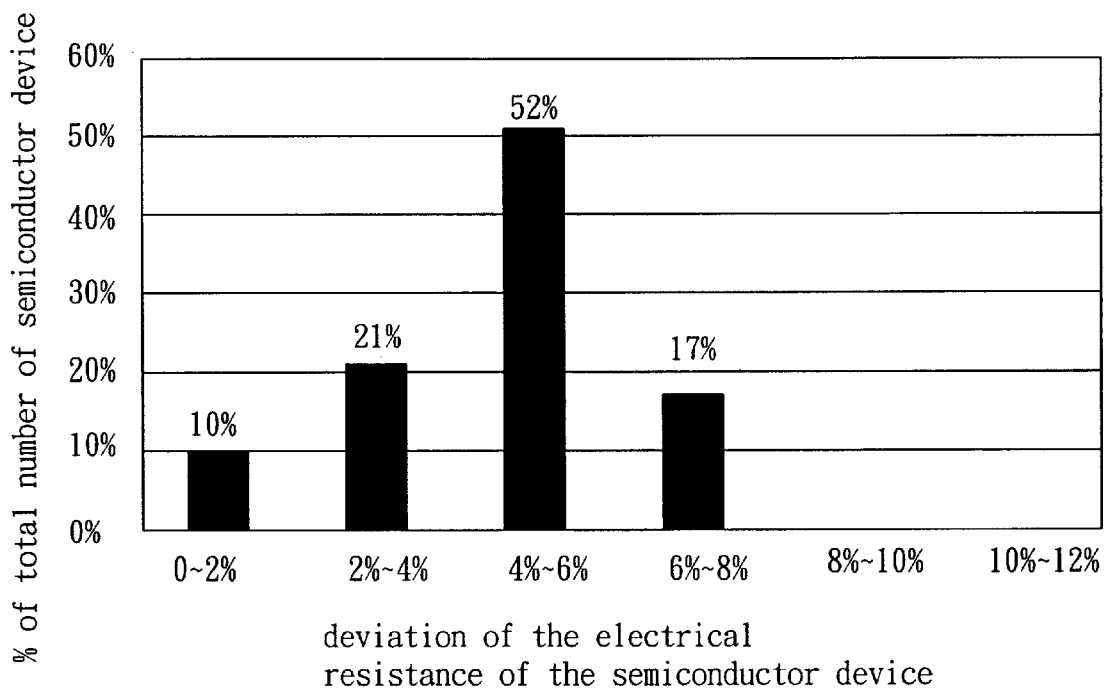
FIGS. 5A and 5B illustrate a comparison of the performance of the power semiconductor device of this invention in the stability of the electrical resistance with that of a conventional power semiconductor device.
Figure 5B:
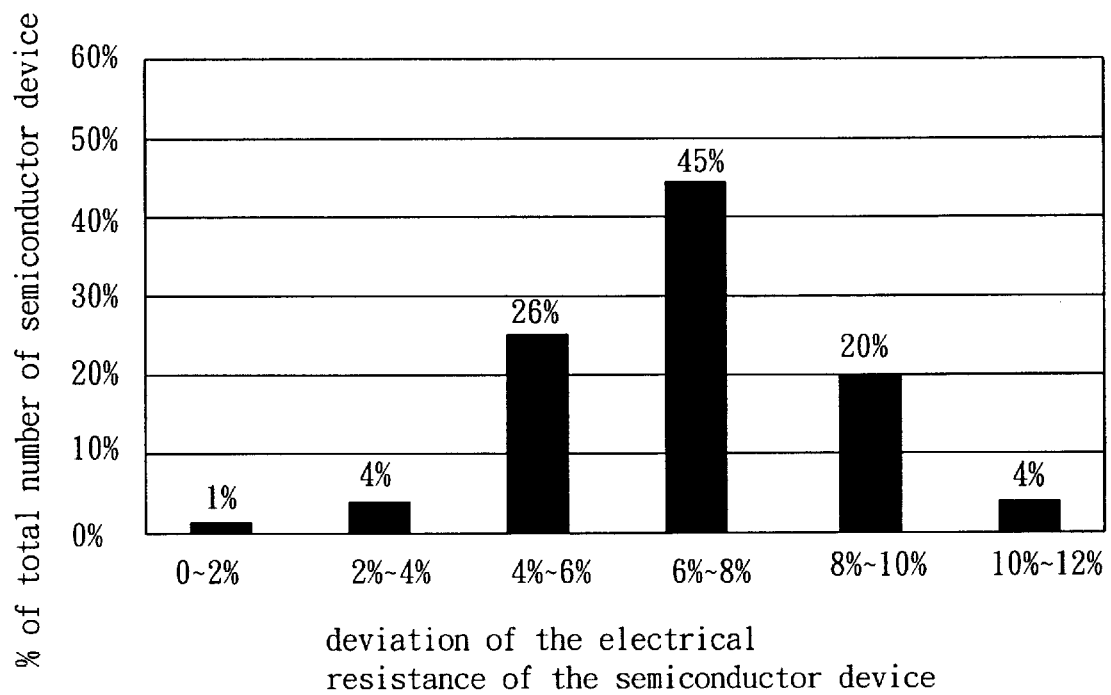

A comparison of the performance of the power semiconductor devices of this invention in the stability of the electrical resistance with that of conventional power semiconductor devices was executed. The stability of the electrical resistance of the power semiconductor devices of this invention or the conventional ones was carried out by measuring initial electrical resistance for each of these power semiconductor devices, subjecting alternately and repeatedly these power semiconductor devices to a temperature of about 150° C. and to a temperature of about −55° C. for 1000 times, and measuring the electrical resistance for each of these thermally treated power semiconductor devices. A deviation in the electrical resistance for each of these power semiconductor device was calculated by comparing the electrical resistance of each of these power semiconductor device to the respective initial electrical resistance. A statistics in the deviation of the electrical resistance of these power semiconductor device is shown in FIGS. 5A (this invention) and 5B (conventional). About 45% of the total number of the tested conventional power semiconductor devices have a deviation in a range of 6–8%, as compared to only 17% for the tested power semiconductor devices of this invention. Moreover, none of the power semiconductor devices of this invention has a deviation greater than 8%, as compared to 24% for the tested conventional power semiconductor devices. The results of the above-described comparison show that the stability of the electrical resistance of the power semiconductor device of this invention is better than that of the conventional one.

With the invention thus explained, it is apparent that various modifications and variations can be made without departing from the spirit of the present invention. It is therefore intended that the invention be limited only as recited in the appended claims.

We claim:

1. A power semiconductor device, comprising:

a semiconductor die that has a bottom surface defining a drain contact, and a top surface which includes a first metallized region defining a source contact and having at least a first groove and a first non-grooved part, a second metallized region defining a primary gate contact, a partitioning region having at least a branch confined by said first groove, and a third metallized region disposed in said branch of said partitioning region and defining a secondary gate contact;

a conductive strip extending from said primary gate contact and having a finger that extends in said branch of said partitioning region and that is connected to said secondary gate contact of said third metallized region;

an insulation layer enclosing said finger of said conductive strip;

a conductive connecting member including a metal sheet and a conductive paste, said metal sheet having a second groove which is aligned with said branch of said partitioning region, and a second non-grooved part which is attached to said source contact at said first non-grooved part of said first metallized region via said conductive paste such that said insulation layer is exposed from said second groove;

a drain terminal electrically connected to said drain contact of said die;

a source terminal electrically connected to said second non-grooved part of said metal sheet; and a gate terminal electrically connected to said primary gate contact of said die.

* * * * *